US008264047B2

(12) United States Patent
Schmidt

(10) Patent No.: US 8,264,047 B2
(45) Date of Patent: Sep. 11, 2012

(54) SEMICONDUCTOR COMPONENT WITH A TRENCH EDGE TERMINATION

(75) Inventor: Gerhard Schmidt, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 241 days.

(21) Appl. No.: 12/776,866

(22) Filed: May 10, 2010

(65) Prior Publication Data
US 2011/0272735 A1 Nov. 10, 2011

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............ 257/396; 257/288; 257/E21.051; 257/E21.352; 257/E21.364; 257/E21.396; 257/E21.435; 257/E21.577

(58) Field of Classification Search .......... 257/396, 257/288, 301, 312, 350, 509, 607, 610, 622, 257/E21.051, E21.352, E21.364, E21.396, 257/E21.435, E21.577
See application file for complete search history.

(56) References Cited

U.S. PATENT DOCUMENTS

| | | | |
|---|---|---|---|
| 4,374,389 A | 2/1983 | Temple | |
| 4,754,310 A * | 6/1988 | Coe | 257/287 |
| 6,900,523 B2 | 5/2005 | Qu | |
| 7,091,557 B2 * | 8/2006 | Deboy | 257/339 |
| 7,187,058 B2 * | 3/2007 | Schmidt | 257/626 |
| 2009/0008723 A1 * | 1/2009 | Schmidt | 257/409 |

FOREIGN PATENT DOCUMENTS

| | | |
|---|---|---|
| DE | 10358985 B3 | 5/2005 |
| DE | 102005061210 B4 | 7/2007 |
| DE | 10 2007 030 755 B3 | 2/2009 |
| DE | 102007040755 A1 | 3/2009 |
| WO | 0038242 A1 | 6/2000 |

OTHER PUBLICATIONS

Shimoyama, K. et al., "A New Isolation Technique for Reverse Blocking IGBT with Ion Implantation and Laser Annealing to Tapered Chip Edge Sidewalls", ISPSD 2006, pp. 1-4.
Théolier et al., "A new junction termination technique: the Deep Trench Termination (DT2)" ISPSD 2009, pp. 176-179.
Baliga, "High-voltage device termination techniques" IEE Proc. vol. 129, Pt. I, No. 5 (1982), pp. 173-179.
Gerlach, "Thyristoren", Springer-Verlag 1979, p. 155 ff.
Brieger et al., "Comparison of different planar passivation techniques for semiconductor power devices", Arch. Elektrotech, Springer-Verlag 1989, pp. 89-94.

* cited by examiner

*Primary Examiner* — David Nhu
(74) *Attorney, Agent, or Firm* — Murphy, Bilak & Homiller, PLLC

(57) ABSTRACT

A semiconductor component includes a semiconductor body having a first surface and a second surface, and having an inner region and an edge region. The semiconductor component further includes a pn-junction between a first semiconductor region of a first conductivity type and a second semiconductor region of a second conductivity type, the pn-junction extending in a lateral direction of the semiconductor body in the inner region. A first trench extends from the first side in the edge region into the semiconductor body. The trench has sidewalls that are arranged opposite to another and that are beveled relative to a horizontal direction of the semiconductor body.

21 Claims, 5 Drawing Sheets

SEMICONDUCTOR COMPONENT WITH A TRENCH EDGE TERMINATION

TECHNICAL FIELD

Embodiments of the present invention relate to power semiconductor components, in particular power semiconductor components having a vertical edge termination or mesa edge termination, respectively.

BACKGROUND

Power semiconductor devices, such as power diodes, power MOSFETs, power IGBTs or power thyristors, are designed to withstand high blocking voltages. Those power devices include a pn-junction that is formed between a p-doped semiconductor region and an n-doped semiconductor region. The component blocks—or is switched off—when the pn-junction is biased in its reverse direction. In this case, a depletion regions or space charge zone propagates in the p-doped and n-doped regions. Usually one of these semiconductor regions is more lightly doped than the other one of these semiconductor region, so that the depletion region mainly extends in the more lightly doped region, which mainly supports the voltage applied across the pn-junction. The semiconductor region supporting the blocking voltage is referred to as base region in a diode or thyristor, and is referred to as drift zone in an MOSFET or IGBT.

The ability of a pn-junction to support high voltages is limited by the avalanche breakdown phenomenon. As a voltage applied across a pn-junction increases, an electric field in the semiconductor regions forming the pn-junction increases. The electric field results in acceleration of mobile carriers present in the semiconductor region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of avalanche breakdown, a significant current flows across the pn-junction in the reverse direction. The voltage at which the avalanche breakdown sets in is referred to as breakdown voltage.

The electric field at which the avalanche breakdown sets in is referred to as critical electric field. The absolute value of the critical electric field is mainly dependent on the type of semiconductor material used for forming the pn-junction, and is weakly dependent on the doping concentration of the more lightly doped semiconductor region.

The critical electric field is a theoretical value that is defined for a semiconductor region that has an infinite size in directions perpendicular to field strength vectors of the electric field. Power semiconductor components, however, have semiconductor bodies of finite size that are terminated by edge surfaces in lateral directions. Due to different reasons, such as imperfections of the crystal lattice at the edge surfaces, the breakdown voltage of the component is reduced in edge regions that are close to the edge surfaces compared to inner regions that are distant to the edge surface. In order to compensate for the reduced breakdown voltage in the edge regions edge terminations are known that serve to reduce the electric field in the regions compared with the inner regions.

Different types of edge terminations are known. So-called vertical edge terminations or mesa terminations, respectively, include specific geometries of the edge surfaces or passivation layers on the edge surfaces. Bevel edge terminations have edge surfaces that are beveled. Bevel edge terminations are, in particular, effective in reducing the electric field in edge regions of semiconductor components that have circular-shaped semiconductor bodies. This is the case when the semiconductor body of the component corresponds to a complete wafer. However, problems in terms of a reduced breakdown voltage in the edge region may occur when the semiconductor body has a rectangular form, like a rectangular form that results from separating a wafer into several semiconductor bodies or dies, respectively.

There is therefore a need for an improved edge termination for semiconductor components, in particular semiconductor components having a semiconductor body with a rectangular geometry.

SUMMARY

According to one embodiment, a semiconductor component includes a semiconductor body having a first surface and a second surface, and has an inner region and an edge region. In the semiconductor body, a pn-junction between a first semiconductor region of a first conductivity type and a second semiconductor region of a second conductivity type extends in a lateral direction of the semiconductor body in the inner region. Further, a first trench extends in the edge region from the first surface into the semiconductor body. The trench has sidewalls that are arranged opposite to another and that are beveled relative to a vertical direction of the semiconductor body.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings, the same reference characters denote like features.

FIG. 11, which includes

DETAILED DESCRIPTION

Figure 1:
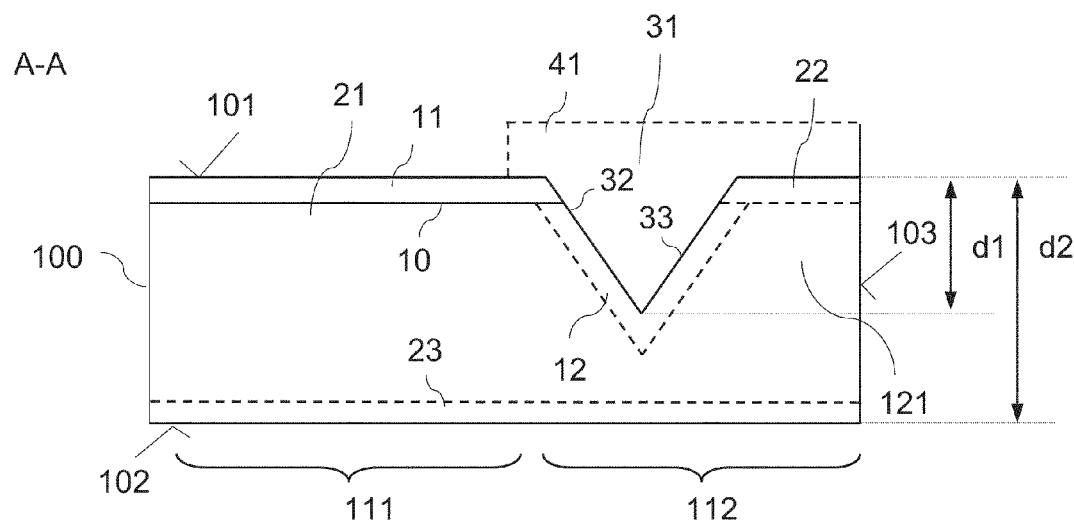
FIG. 1 illustrates a vertical cross section through a vertical semiconductor component according to a first embodiment.
Figure 2:
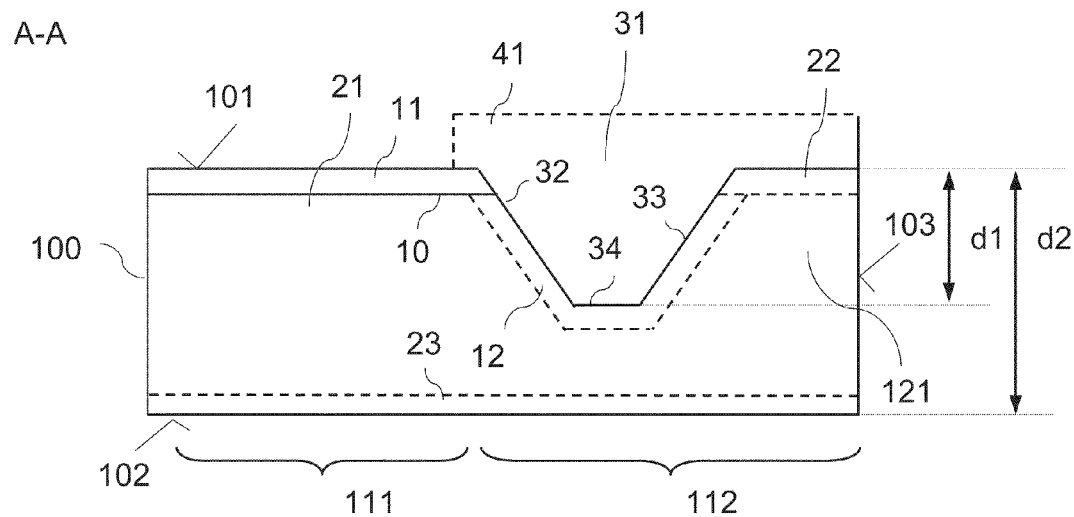
FIG. 2 illustrates a vertical cross section through a vertical semiconductor component according to a second embodiment.

FIGS. 1 and 2 schematically illustrates a vertical semiconductor component, in particular a power semiconductor component. The semiconductor component includes a semiconductor body or semiconductor layer 100 with a first surface 101 and a second surface 102 that are arranged opposite to one another and that are essentially parallel to one another. FIG. 1 illustrates a vertical cross section through the semiconductor body 100 in a section plane that runs perpendicular to the first and second surfaces 101, 102. The semiconductor body 100 further includes an inner region 111 and an outer region or edge region 112, with the edge region 112 being arranged between the inner region 111 and an edge surface 103. The edge surface 103 extends between the first and the second surfaces 101, 102 and terminates the semiconductor body 100 in a lateral direction, while the first and second surfaces 101, 102 terminate the semiconductor body 100 in a vertical direction. The "vertical direction" is a direction that runs perpendicular to the first and second surfaces 101, 102, while the "lateral direction" or "horizontal direction" runs perpendicular to the vertical direction. According to one embodiment, the edge surface 103 is a vertical surface, i.e., a surface that extends perpendicular to the first and second surfaces 101, 102. However, this is only an example. The edge surface 103 could also be beveled.

The term "surface" in connection with the present disclosure is used for those planes that terminate the semiconductor body 100. In this connection it should be mentioned that the term surfaces is also used for such surfaces that are covered by other layers, like electrode layers, passivation layers, etc., in the component after its completion. However, such additional layers are not illustrated in FIGS. 1 and 2.

FIGS. 1 and 2 only illustrate a part of a cross section of the semiconductor component, namely that part that includes the edge region 112 on one lateral side of the semiconductor body 100 and that only includes a part of the inner region 111. In this connection, it should be mentioned that in a horizontal plane the area of the inner region 111 is usually larger than the area of the edge region 112. Generally, it is desirable to minimize the area of the edge region 112 relative to the overall area of the semiconductor body 100.

Referring to FIGS. 1 and 2, the semiconductor component further includes a pn-junction 10 extending in a lateral or horizontal plane in the inner region 111 of the semiconductor body 100. The pn-junction 10 is a junction between a first semiconductor region 11 of a first conductivity type and a second semiconductor region 21 of a second conductivity type. According to a first embodiment, the first semiconductor region 11 is a p-doped region and the second semiconductor region 21 is an n-doped region. According to a second embodiment, the first semiconductor region 11 is an n-doped region and the second semiconductor region 21 is a p-doped region.

In the vertical direction of the semiconductor body 100, the first semiconductor region 11 is arranged between the first surface 101 and the second semiconductor region 21. In the embodiments illustrated in FIGS. 1 and 2, the first semiconductor region 11 adjoins the first surface 101. However, this is only an example. The first semiconductor region could also be arranged distant to the first surface 101 in the vertical direction.

According to one embodiment the second semiconductor region 21 is more lightly doped than the first semiconductor region 11. The doping concentration of the first semiconductor region 11 is, for example, in the range of between 1E16 cm$^{-3}$ (=1·10$^{16}$ cm$^{-3}$) and 1E21 cm$^{-3}$. The doping concentration of the second semiconductor region 21 is, for example, in the range of between 5E21 cm$^{-3}$ (=5·10$^{21}$ cm$^{-3}$) and 1E16 cm$^{-3}$.

The semiconductor component further includes an edge termination with at least one trench 31 which, starting from the first surface 101, extends in a vertical direction into the semiconductor body 100. The at least one trench 31 includes a first sidewall 32 and a second sidewall 33 that are arranged opposite to one another. These sidewalls are beveled sidewalls and have bevel angles of between 45° to 55° relative to the horizontal direction.

Referring to FIG. 1, the at least one trench 31 may include a V-shaped cross section. In this case, the first and second sidewalls 32, 33 adjoin one another at the bottom of the trench 31. Referring to FIG. 2, the at least one trench 31 could also have a trapezoid cross section. In this case the at least one trench 31 includes a bottom surface 34 that adjoins the first and second sidewalls 32, 33 on opposite sides.

The at least one trench 31 is arranged distant to the edge surface 103 in a lateral direction of the semiconductor body 100. A region of this semiconductor body 100 between the edge surface 103 and the trench 31 will be referred to as mesa region 121 in the following. The first sidewall 32 of the trench 31 is the sidewall that lies in the direction of the inner region 111, while the second sidewall 33 of the trench 31 is the sidewall that adjoins the mesa region 121.

Optionally, the semiconductor component further includes a passivation layer 41 that at least covers the first and second sidewalls 32, 33 and the bottom surface 34, if there is one, of the at least one trench 31, or that completely fills the at least one trench 31. Optionally, the passivation layer 41 also covers the first surface 101 on top of the mesa region 121. The passivation layer 41 is, for example, an oxide layer, a nitride layer, or an amorphous layer, such as a DLC layer (DLC=Diamond Like Carbon), a hydrogen containing amorphous carbon layer (aC:H) or a hydrogen containing amorphous silicon layer (aSi:H) or a hydrogen containing amorphous silicon-carbide (aSi$_x$C$_{1-x}$:H) layer.

For implementing the semiconductor body 100, any a suitable semiconductor material, such as silicon (Si), silicon-carbide (SiC), gallium nitride (GaN) can be used. The semiconductor body 100 is a monocrystalline semiconductor body. According to one embodiment, the semiconductor body 100 has a basic doping of the second conductivity type with a doping concentration that corresponds to the doping concentration of the second semiconductor region 21. In this case, those regions of the semiconductor body that have the basic doping concentration form the second semiconductor region, while the other semiconductor regions, such as the first semiconductor region 11, are produced by implanting or diffusing dopants into the semiconductor body 100.

The at least one trench 31 and the mesa region 121 between the trench 31 and the edge surface 103 form an edge termination of the semiconductor component. Like conventional edge terminations, this edge termination helps to reduce a maximum field strengths of an electric field in the edge region. Such electric field occurs when the pn-junction 10 is biased in its reverse direction. The functionality of this edge termination will be explained with reference to FIGS. 4 and 5 herein further below.

The pn-junction 10 may extend to the first sidewall 32 of the trench 31. In this case, both the first and second semiconductor regions 11, 21 in the lateral direction extend to the first side wall 32. However, optionally a third semiconductor region 12 that is of the first conductivity type and that is more lightly doped than the first semiconductor region 11 is arranged between the second semiconductor region 21 and the second side wall 32. Optionally, this third semiconductor region also extends along the second side wall 33 and the bottom surface 34, if there is one. A doping dose of the third semiconductor region 12 is selected such that the doping dose is below the breakthrough charge, which is about 1.4E12 $cm^{-3}$ for silicon. The doping dose is the integral of the doping concentration in the third semiconductor region 12 in a direction perpendicular to the first and second surfaces 32, 33, respectively.

The second semiconductor region 21—unlike the first semiconductor region 11—is not limited to the inner region 111, but in the lateral direction also extends into the edge region 112 and surrounds the trench 31. Major parts of the mesa region 121 are formed by the second semiconductor region 21. According to one embodiment, the semiconductor component in the mesa region includes a channel stopper region 22 of the second conductivity type. The channel stopper 22 region may extend in the lateral direction from the second sidewall 33 of the trench 31 to the edge surface 103 and is more highly doped than the second semiconductor region 21. A doping concentration of the channel stopper region is, for example, in the range of between 1E17 $cm^{-3}$ and 1E21 $cm^{-3}$. A depth, which is the dimension in the vertical direction, of the channel stopper region is, for example, in the range of between 5 μm and 10 μm.

The at least one trench 31 does not completely extend through the semiconductor body 100 in the vertical direction and does not completely extend through the second semiconductor region 21. According to one embodiment, a maximum depth d1 of the trench 31 is, for example, between 30% and 80%, in particular between 40% and 70% of a thickness d2 of the semiconductor body 100 in the vertical direction. According to a second embodiment, a maximum depth of the trench 31 is, for example, between 30% and 80% of a thickness of the second semiconductor region 21 in the vertical direction. The second alternative is, in particular, valid in those cases in which the semiconductor body 100, besides a semiconductor layer in which the first and the second semiconductor regions 11, 21 are formed, includes a semiconductor substrate (not shown) on which this semiconductor layer is arranged and that is significantly thicker than this semiconductor layer. Such semiconductor layer could, in particular, be an epitaxial layer.

The doping concentration of the second semiconductor region 21 is usually significantly lower than the doping concentration of the first semiconductor region 11. When the pn-junction is biased in its reverse direction, a space charge region or depletion region mainly propagates in the second semiconductor region 21. In order to "stop" an electric field that is associated with this depletion region, the component optionally includes a field-stop region 23 of the second conductivity type. The field stop region 23 adjoins the second semiconductor region 21 at that side that faces away from the first semiconductor region 11. The field-stop region 23 has a higher doping concentration than the second semiconductor region. The doping concentration of the field-stop region is, for example, in the range of between 1E14 $cm^{-3}$ and 1E16 $cm^{-3}$. A thickness (vertical dimension) of the field-stop zone 23 is, for example, in the range of between 10 μm to 20 μm and can be up to 50 μm.

Figure 3:
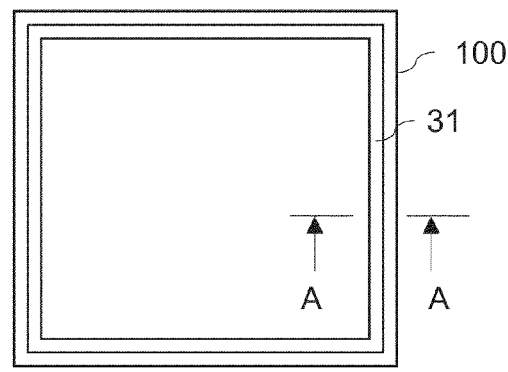
FIG. 3 illustrates a top view on a first surface of a semiconductor body of an embodiment of a semiconductor component.

FIG. 3 schematically illustrates a top plan view on the first surface 101 of the semiconductor body 100. Referring to FIG. 3, the semiconductor body has a rectangular geometry, in particular a square geometry. The at least one trench 31 may extend completely along the edge surface 103, so that the at least one trench 31 completely surrounds the inner region 111. The use of a semiconductor body 100 with a rectangular geometry is, however, only an example. Any other geometry, such as a circular geometry of the semiconductor body 100 may be used as well. The cross sections illustrated in FIGS. 1 and 2 are cross sections in a section plane A-A illustrated in FIG. 3. This section plane A-A extends perpendicular to a longitudinal direction of the trench 31.

Figure 4:
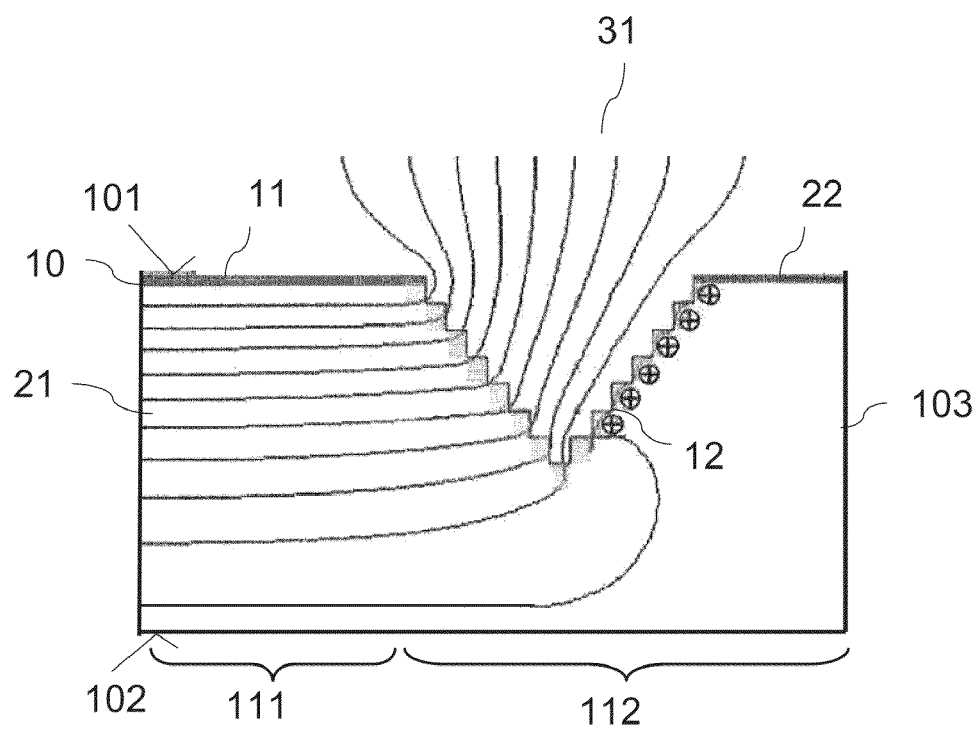
FIG. 4 illustrates equipotential lines of an electric field in an edge region of the semiconductor component according to FIG. 1 when a pn-junction of the component is biased in its reverse direction.
Figure 5:
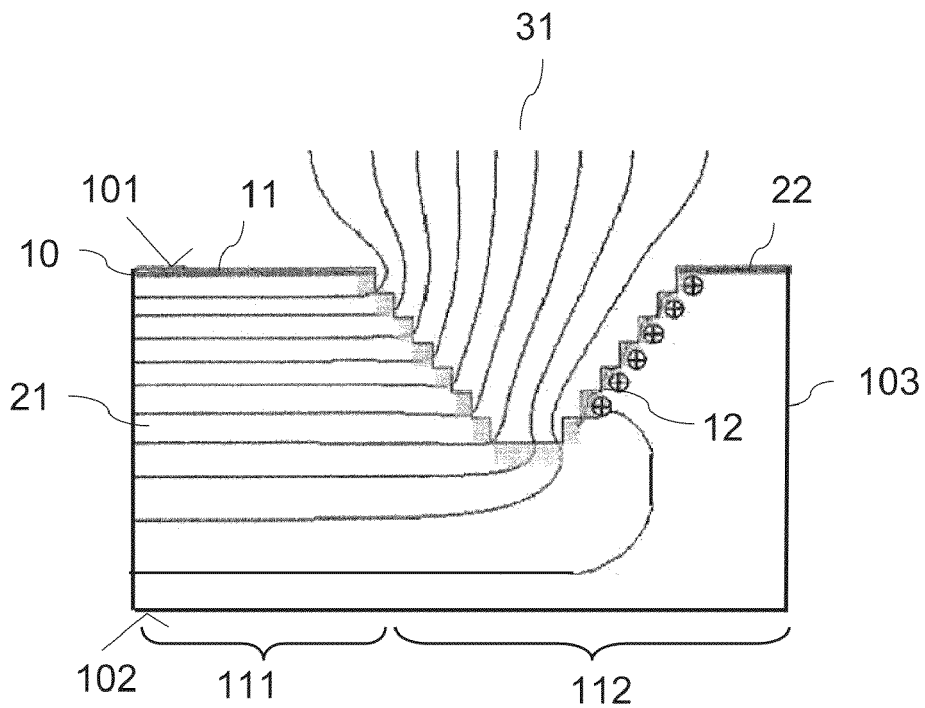
FIG. 5 illustrates equipotential lines of an electric field in an edge region of the semiconductor component according to FIG. 2 when a pn-junction of the component is biased in its reverse direction.

The function of the edge termination formed by the at least one trench 31 and the mesa region 121 is to reduce the electric field strength in the edge region 112 of the semiconductor body 100 when the pn-junction is reversed in its bias direction, so that a depletion region extends in the second semiconductor region 21. This operating principle will be explained with reference to FIGS. 4 and 5. In these figures, the equipotential lines of electric fields which occur when reverse-biasing the pn-junctions 10 in the components of FIGS. 1 and 2 are illustrated. The illustrations in FIGS. 4 and 5 are based on computer simulations. For simulation purposes, the semiconductor body 100 was subdivided in a plurality of horizontal semiconductor slices. For this reason, the sidewalls of the trench 31 appear stepped in FIGS. 4 and 5. In reality, the sidewalls of the trench 31 have plain surfaces.

Referring to FIGS. 4 and 5, the equipotential lines extend substantially horizontally in the inner region 111 of the semiconductor body. The equipotential lines leave the semiconductor body 100 in the trench 31, where a maximum field strength occurs at the bottom of the trench. This is the region where a first voltage breakdown in the component occurs when reverse voltage applied to the pn-junction reaches a maximum value. Referring to FIGS. 4 and 5 the electric field does not extend or does not significantly extend into the mesa region 121, i.e., the mesa region 121 is relatively free of an electric field when the pn-junction 10 is biased in its reverse direction.

Extending of the electric field into the mesa region 121 is partially or totally prevented by electric charges that accumulate in the mesa region 121 along the second sidewall 33. These electric charges are positive charges (holes) when the first semiconductor region 11 is p-doped and the second semiconductor region 21 is n-doped. These electric charges are, for example, generated by thermal charge carrier generation.

In a conventional manner, the pn-junction can be reverse biased by applying a suitable voltage between the first and second semiconductor regions 11, 21, wherein this voltage is a negative voltage when the first semiconductor region 11 is p-doped and the second semiconductor region 21 is n-doped, and is a positive voltage when the first semiconductor region 11 is n-doped and the second semiconductor region 21 is p-doped. The electric potential of the mesa region 121 corresponds to the electric potential that is applied to the second semiconductor region 21 when biasing the pn-junction in its reverse direction.

The simulation results illustrated in FIGS. 4 and 5 were obtained based on a semiconductor component with a p-type semiconductor region 11 with an surface doping concentration of 1E17 $cm^{-3}$, with the first semiconductor region 11 extending 6 μm into the vertical direction, and with a doping concentration of the second semiconductor region 21 of about 8E13 $cm^{-3}$.

If the component includes the field-stop region 23, then for reverse biasing the pn-junction the reverse-biasing voltage is applied between this field stop region 23 and the first semiconductor region 11. The simulation was based on the semiconductor body 100 with such field stop region 23 with a doping concentration of about $1.3E14$ cm$^{-3}$ and a depth, which is the dimension in the vertical direction, of 10 µm. The channel stopper region 22 had a doping concentration of about $1E18$ cm$^{-3}$ and a vertical dimension (thickness) of about 6 µm in the simulation.

A thickness d2 of the semiconductor body 100 was 125 µm and a depth of the trench 31 was 80 µm, which equals 64% of the thickness d2 of the semiconductor body 100, in the simulation. The simulation revealed that the blocking voltage capability of the pn-junction in this specific example is in the range of about between 1400V and 1700V. This voltage blocking capability is lower than the voltage blocking capability of about 1800V that could be obtained in the inner region 111 of the component and that could theoretically be obtained in the edge region 112 when a vertical edge termination (not shown) would be used. A "vertical edge termination" is an edge termination in which the pn-junction extends to the edge surface (103 in FIGS. 4 and 5) of the semiconductor body. In a component with a vertical edge termination, an electric field is also present in the edge region, in particular along the edge surface.

In particular, in the edge region along the edge surface 103 of a semiconductor component, like a power semiconductor component, parasitic charges can be present. These charges can result from a mold (not shown) that encloses the semiconductor body 100 after packaging the component, or from a solder that can be used for mounting the semiconductor body 100 to a carrier (not shown). When these charges are subject to an electric field, they can negatively influence the voltage blocking capability of the component, and can for example cause a decrease of the voltage blocking capability over time.

The edge termination illustrated in FIGS. 1 and 2 prevents such negative influences of parasitic charges, because the electric field stops in the region of the trench 31, so that parasitic charges that are present along the edge surface 103 are not subject to this electric field.

Figure 6:
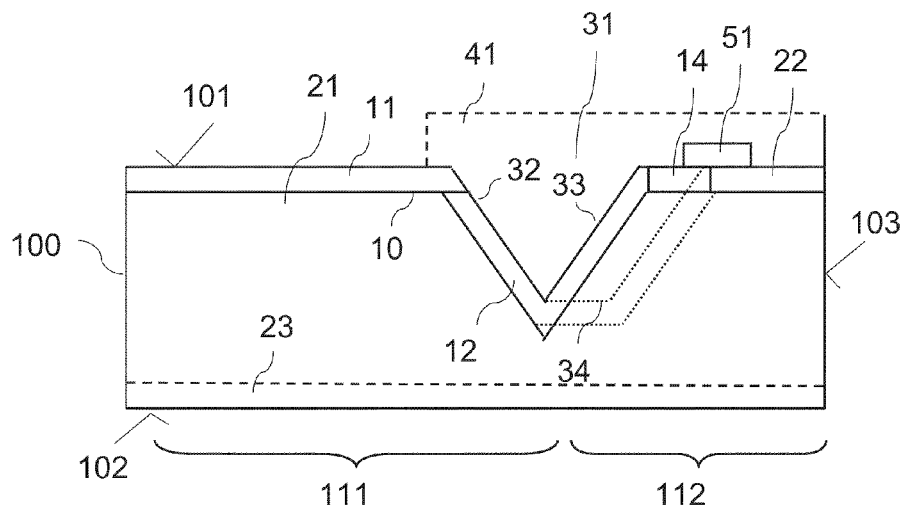
FIG. 6 illustrates a cross section through a vertical semiconductor component according to a further embodiment.

The charge carrier that accumulates along the second sidewall 33 of the trench 31 can be thermally generated charge carriers. However, such thermal generation of charge carriers takes some time, with the effect, that for the component reaching the maximum voltage blocking capability would take some time. The provision charge carriers, such as holes when the second semiconductor region 21 is n-doped, can be accelerated by providing a charge carrier source in the mesa region 121. Such charge carrier source can be a further region 14 of the first conductivity type which is arranged in the mesa region 121 between the trench 31 and the edge surface 103, and which is short-circuited with the channel stopper 22 via a conductor 51 as shown in the embodiment of FIG. 6. Conductor 51 is, for example, a metal or a highly doped polysilicon. This semiconductor region 14 acts as a charge carrier source and is arranged between the trench 31 and the channel stopper 22, wherein the channel stopper 22 in a horizontal direction extends to the edge surface 103. When the component is in operation, the electric potential of the channel stopper 22 corresponds to the electric potential of the second semiconductor region 21 in the region of the second surface 102. When the pn-junction 10 is reverse biased by applying a voltage between the first and the second semiconductor regions 11, 21, the semiconductor region 14 connected with the channel stopper emits p-type charge carriers (holes) into the mesa region 121 that accumulate along the second sidewall 33 of the trench 31 instantaneously without significant time delay as in the case of thermal generation.

The edge termination with the trench 31 and the mesa region 121 between the trench 31 and the edge surface 103 can be implemented in any kind of vertical semiconductor components that have at least one pn-junction, such as diodes, MOS or bipolar transistors, IGBTs, or thyristors.

Figure 7:
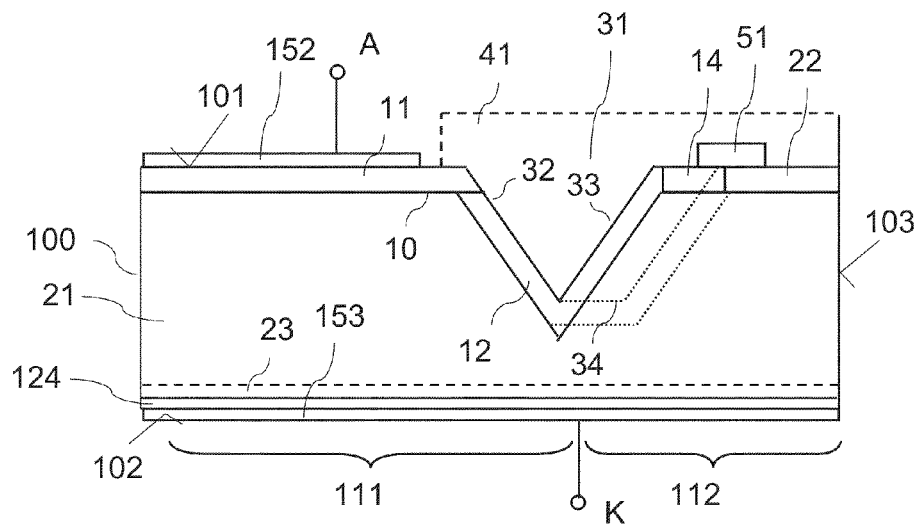
FIG. 7 illustrates a vertical cross section through a semiconductor component that is implemented as a diode.

FIG. 7 illustrates an embodiment of a vertical semiconductor component implemented as a diode. In this semiconductor component, the first semiconductor region 11 forms a first emitter, like a p-emitter, of the diode, and the second semiconductor region 21 forms a base region, like an n-base. The diode further includes a second emitter region 124 that is of the second conductivity type and that is more highly doped than the base region 21. The base region 21 is arranged between the first and the second emitter regions 11, 124. The optional field-stop region 23 is arranged between the base region 21 and the second emitter region 124.

The first emitter region 11 is contacted by a first electrode 152, and the second emitter region 124 is contacted by a second electrode 153. When the first emitter region 11 is p-doped, the first electrode 152 forms an anode A and the second electrode 153 forms a cathode K of the diode.

Figure 8:
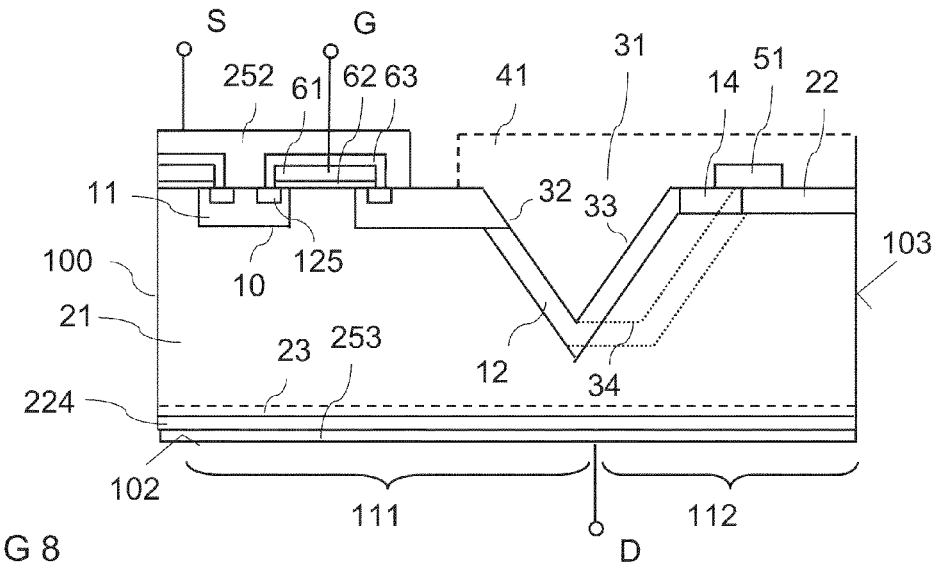
FIG. 8 illustrates a vertical cross section through a semiconductor component that is implemented as a MOS transistor.

FIG. 8 illustrates a vertical semiconductor component implemented as a MOS transistor. In this component, a first semiconductor region 11 forms a body zone and the second semiconductor region 21 forms a drift zone. In an n-type MOS transistor, the body zone 11 is p-doped and drift zone 21 is n-doped, and in a p-type MOS transistor the body zone 11 is n-doped and the drift zone 21 is p-doped. The MOS transistor further includes at least one source region 125 of the second conductivity type that is separated from the drift zone 21 by the body zone 11. A gate control structure with a gate electrode 61 and a gate dielectric 62 is arranged adjacent to the body zone 11 and extends from the source zone 125 to a section of the drift zone 21. In the embodiment illustrated in FIG. 8, the gate electrode 61 is a planar electrode that is arranged above the first surface 101. However, this is only an example, other types of gate electrodes, such as trench electrodes may be applied as well. The MOS transistor may include a cell-like structure with a plurality of identical structures each including a source zone 125 and a gate electrode 61 or a section of a gate electrode.

The MOS transistor further includes a drain region 224 of the second conductivity type which is more highly doped than the drift region 21. Drift region 21 is arranged between the body region 11 and the drain region 224. Optional field stop region 23 is arranged between the drift region 21 and the drain region 224.

The MOS transistor can be implemented as a MOSFET or an IGBT. In a MOSFET, the drain region 224 is of the same doping type as drift region 21. In an IGBT, the drain region 224 is doped complementarily to the drift region 21. This drain region 224 is also referred to as emitter region in an IGBT. In case of an IGBT, the drain region 224 can include bypasses (not shown) at which the drift zone 21 can contact the drain electrode. These bypasses are also known as drain or emitter shorts. In this way, a reverse conducting (RC) IGBT is obtained. This is an IGBT can block voltages only in the forward direction, i.e., when applying a positive voltage between drain D and source S.

The MOS transistor further includes a first electrode 252 that acts as a source electrode and contacts source regions 125 and body region 11, and a second electrode 253 that acts as a drain electrode and contacts the drain region 224.

Figure 9:
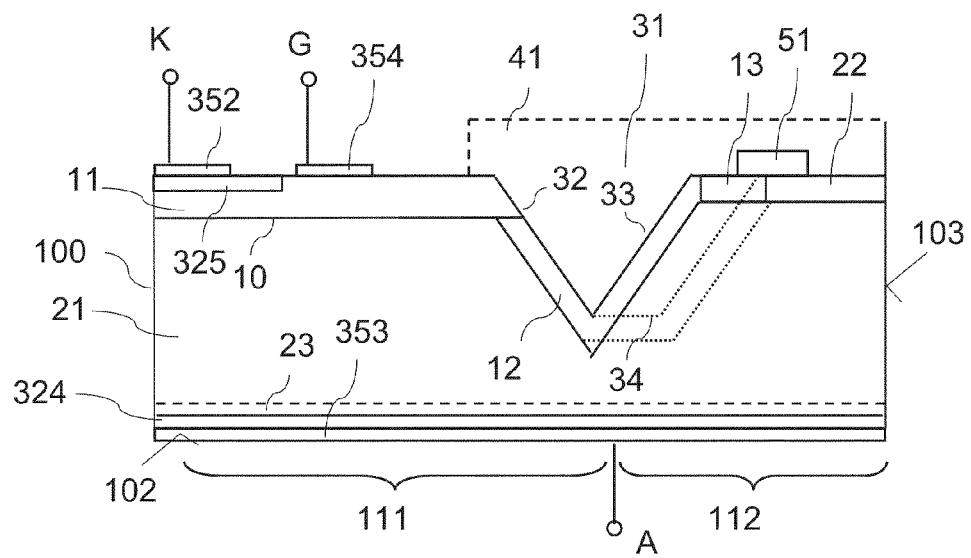
FIG. 9 illustrates a vertical cross section through a semiconductor component that is implemented as a thyristor.

FIG. 9 illustrates a vertical cross section through a semiconductor component implemented as a thyristor. In this thyristor, the first semiconductor region 11 forms a first base region, such as a p-base, of the thyristor, the second semiconductor region 21 forms a second base region, such as an n-base of the thyristor. The first base region 11 is contacted by a control electrode 354. The component further includes a first emitter region 325 of the second conductivity type that is contacted by a first electrode 352, and a second emitter region 324 of the first conductivity type and contacted by a second electrode 353. The first base region 11 is arranged between the first emitter region 25 and the second base region 21, and the second base region 21 is arranged between the first base region 11 and the second emitter region 324. In this component, the first electrode 352 forms a cathode terminal, the second electrode 353 forms an anode terminal, and the control electrode forms a gate terminal.

Figure 10:
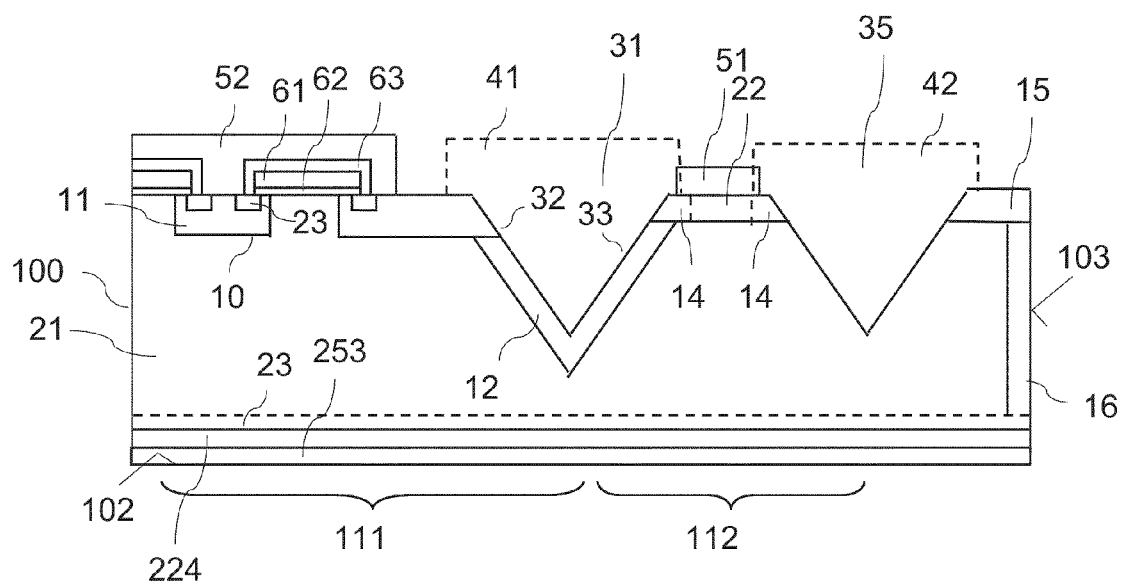
FIG. 10 illustrates a vertical cross section through a further semiconductor component implemented as a reverse blocking (RB) IGBT.

FIG. 10 illustrates a cross section through a reverse blocking (RB) IGBT according to a further embodiment. A RB IGBT has two pn-junctions: a first pn-junction 10 between the body zone 11 and the drift zone 21; and a second pn-junction between the drift zone 21 or the field-stop zone 23, respectively, and the drain zone 224. Thus, there are no drain shorts. The structure of this IGBT—except for its edge region 112—corresponds to the structure of the MOS transistor illustrated in FIG. 8 to which reference is made.

Usually, the drift zone 21 of an IGBT is n-doped and the body zone 11 and the drain zone 224 are p-doped. In this case, the first pn-junction 10 is reverse biased when applying a positive voltage between drain D and source S, and the second pn-junction is reverse biased when applying a positive voltage between source S and drain D.

The edge termination of this component includes the trench 31 with the sidewalls 32, 33 and the optional third semiconductor region 12 along at least the first sidewall 32. The edge termination further includes a second trench 35 that is arranged between the first trench 31 and the edge surface 103 and that also extends from the first surface 101 into the semiconductor body. Concerning the geometry and the dimension of the second trench 35, the explanation that has been given hereinabove with reference to the trench 31 applies to the second trench 35, accordingly. The two trenches 31, 35 can have identical geometries and depths or can be different in terms of geometry or depth. Optionally, the second trench 35 is filled with or has at least its sidewalls covered with a passivation layer 42.

In the horizontal direction, the first trench 31 and the second trench 35 are arranged distant to one another, wherein the channel stopper region 22 is arranged between the first and second trenches 31, 35 along the first surface 101. Optionally, there is at least one semiconductor region 14 acting as a charge carrier source arranged and connected to the channel stopper region 22 via conductor 51.

The second trench is arranged distant to the edge surface 103, wherein a further region 15 of the first conductivity type is arranged between the second trench 35 and the edge surface 103 along the first surface. This further region 15 forms a pn-junction with the second semiconductor region 21 in the edge region of the component. The doping concentration of this region 15 is, for example, in the range of the doping concentration of the first semiconductor region 11 which together with the second semiconductor region 21 forms the first pn-junction 10. The channel stopper region 15 is connected to the drain region 224 through a connection region 16 of the second conductivity type which extends between the drain region 224 and the channel stopper region 15 along the edge surface 103. The doping dose of this region 16 corresponds, for example, at least to the breakdown charge, or is significantly higher than the breakdown charge. When the second pn-junction is reverse biased, the connection region 16 keeps the channel stopper region 15 and the region along the edge surface 103 on the electric potential of the drain region 224.

The first and the second trenches 31, 35 with the surrounding or adjoining semiconductor regions form two edge terminations: a first edge termination with the first trench 31 that is "active" when the first pn-junction 10 is reverse biased; and a second edge termination with the second trench 35 that is "active" when the second pn-junction is reverse biased.

The edge termination with the two trenches 31, 35 illustrated in FIG. 10 is not restricted to be used in connection with a RB IGBT, but can be used in connection with any semiconductor component that includes two pn-junctions, such as GTOs, or thyristors.

In the components illustrated in FIGS. 7 to 9, the highly doped semiconductor region arranged at the second surface 102 of the semiconductor body 100, i.e., the second emitter 124 in the diode of FIG. 7, the drain zone 224 in the MOS transistor of FIG. 8, and the second emitter 324 in the thyristor of FIG. 9 can be diffused or implanted semiconductor regions that are obtained by diffusion or implanting dopants into the semiconductor body 100 via the second surface 102. In this case, the semiconductor body 100 may have a basic doping that corresponds to the doping of the second semiconductor region 21, wherein the other semiconductor regions are produced by diffusing and/or implanting dopants into the semiconductor body 100. According to a further embodiment, these semiconductor regions 124, 224, 324 are implemented as a semiconductor substrate on which an epitaxial layer is arranged, wherein in this epitaxial layer the second semiconductor region 21 and the other semiconductor regions that are disposed close to the first surface 101 are arranged.

Figure 11A:
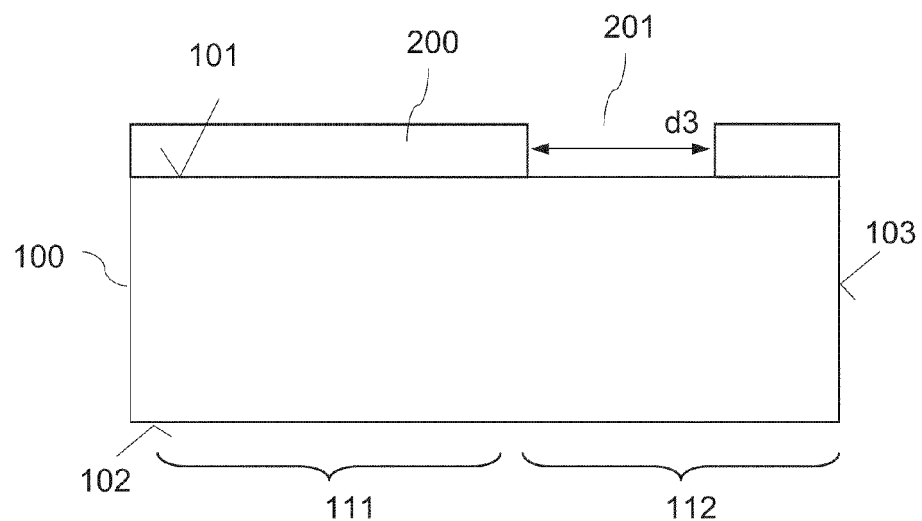
FIGS. 11A to 11C, illustrates an embodiment of a method for forming a trench with beveled sidewalls in a semiconductor body.
Figure 11B:
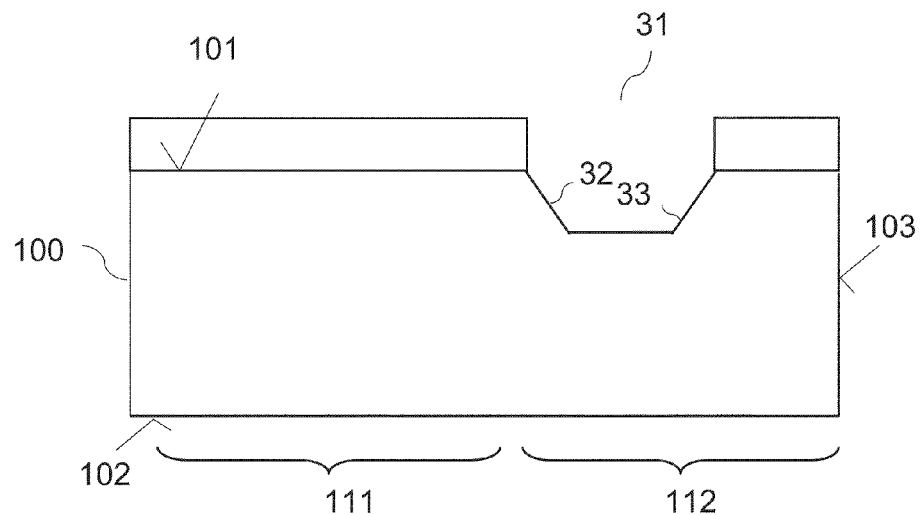
Figure 11C:
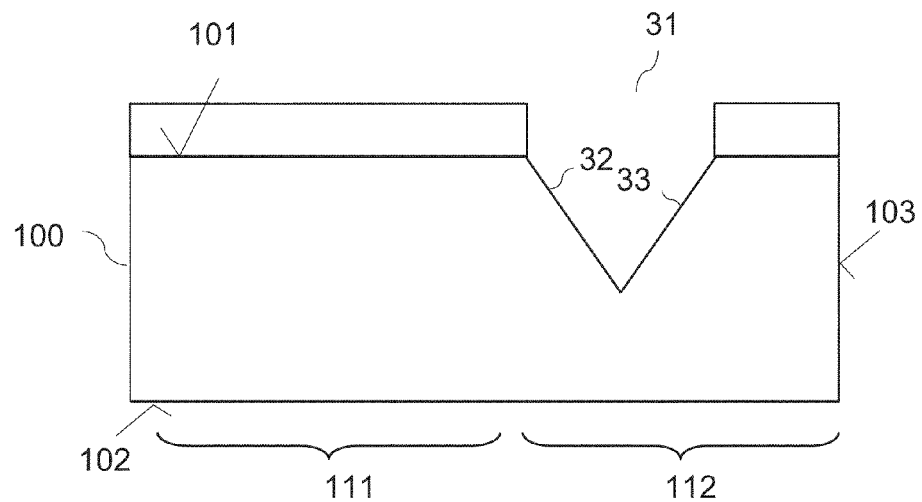

A method for producing the first trench 31 of the edge termination that has been explained hereinabove is illustrated in FIGS. 11A to 11C. This method can, of course, also be applied for producing the second trench 35.

Referring to FIG. 11A, the method includes providing a mask 200 on the first surface 101 of the semiconductor body 100. The mask has an opening 201 at that position at which the trench is to be produced. A width d3 of the opening 201 defines the width of the trench at the first surface 101.

Referring to FIG. 11B, the semiconductor body 100 is then etched using an alkaline etchant, such as TMAH, with alcoholic additives. The etchant is selected such that it etches crystal planes of the semiconductor crystal of the semiconductor body 100 that extend beveled with a bevel angle of between 45° and 55° relative to the first surface 101. According to one embodiment, the semiconductor body 100 is made of silicon, the first surface 101 corresponds to the <100> crystal plane, and the first and second surfaces correspond to <110> or <111> crystal plane. Whether the <110> crystal plane or the <111> <111> crystal plane is etched, is dependent on the alignment of the mask 200 or the opening. If the mask is aligned in the crystal direction, then the <110> crystal plane is etched, and if the mask is aligned 45° relative to the crystal direction, then the <111> crystal plane is etched. Etching the <110> crystal plane results in bevel angles of 45° of the sidewalls 31, 32, and etching the <111> crystal plane results in bevel angles of 54.7° of the sidewalls 32, 33.

FIG. 11B illustrates a cross section of the semiconductor body 100 after the semiconductor body 100 was exposed to the etchant for a certain time. At this time, upper portions of the sidewalls 32, 33 have already been etched. The depth of the trench 31 can be adjusted by selecting the etch time. The etching process automatically stops when the sidewalls 32, 33 adjoin one another at the bottom of the trench 31, so that a V-shaped trench is formed. This is illustrated in FIG. 11C.

When the etching process is stopped before the sidewalls adjoin one another, a trench with beveled sidewalls 32, 33 and a bottom surface 34 is obtained e.g. as illustrated in FIG. 2.

The trench 35 can be etched before the semiconductor regions in the inner region 111 of the semiconductor component are formed or after these semiconductor regions are formed. The third semiconductor region 12 along the trench sidewalls 32, 33 is, for example, formed by implanting and/or diffusing dopants into the semiconductor body 100 after forming the trench 31.

Finally, it should be pointed out that features that have been explained with reference to one embodiment can also be combined with features of other embodiments.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor component, comprising:
   a semiconductor body having a first surface and a second surface, and having an inner region and an edge region;
   a pn junction between a first semiconductor region of a first conductivity type and a second semiconductor region of a second conductivity type, the pn-junction extending in a lateral direction of the semiconductor body in the inner region, wherein the first semiconductor region is arranged between the first surface and the second semiconductor region;
   a first trench extending from the first surface in the edge region into the semiconductor body, wherein the trench has sidewalls that are arranged opposite to one another and that are beveled relative to a horizontal direction of the semiconductor body;
   wherein the second semiconductor region extends beyond the first trench in the lateral direction.

2. The semiconductor component of claim 1, wherein the semiconductor body further comprises an edge surface, wherein the trench is arranged distant to the edge surface.

3. The semiconductor component of claim 1, wherein at least the first semiconductor region of the first and second semiconductor regions in the lateral direction extends to the first trench.

4. The semiconductor component of claim 1, wherein the first trench is V-shaped.

5. The semiconductor component of claim 1, wherein a third semiconductor region of the first conductivity type is arranged between the second semiconductor region and the first trench.

6. The semiconductor component of claim 5, wherein the third semiconductor region extends along the sidewalls of the trench.

7. The semiconductor component of claim 1, wherein the semiconductor body has a thickness and the first trench has a depth in the vertical direction, and wherein the depth is less than 70% of the thickness.

8. The semiconductor component of claim 1, wherein the second semiconductor region semiconductor has a thickness in a vertical direction of the semiconductor body and the first trench has a depth in the vertical direction, and wherein the depth is less than 70% of the thickness of the second semiconductor region.

9. The semiconductor component of claim 1, wherein the first trench in the vertical direction does not extend beyond the second semiconductor region.

10. The semiconductor component of claim 2, further comprising a channel stopper region of the second conductivity type that is more highly doped than the second semiconductor region and that is arranged between the first trench and the edge surface along the first surface.

11. The semiconductor component of claim 10, further comprising a charge carrier source region of the first conductivity type that is arranged between the first trench and the edge surface and that is connected with the channel stopper zone region.

12. The semiconductor component of claim 1, further comprising a field-stop region of the second conductivity type that is arranged distant to the first semiconductor region in the second semiconductor region and that is more highly doped than the second semiconductor region.

13. The semiconductor component of claim 2, further comprising:
    a second trench extending from the first surface between the first trench and the edge surface into the semiconductor body, wherein the second trench is arranged distant to the first trench and distant to the edge surface;
    a further channel stopper region of the first conductivity type that is arranged between the second trench and the edge surface along the first surface.

14. The semiconductor component of claim 13, further comprising:
    an emitter or drain region of the first conductivity type that is arranged distant to the first semiconductor region in a vertical direction of the semiconductor body and that is arranged in the inner region and the edge region;
    a connection region of the semiconductor conductivity type that extends in the edge region between the emitter or drain region and the further channel stopper region.

15. The semiconductor component of claim 14, wherein the connection region extends along the edge surface.

16. The semiconductor component of claim 14, wherein the semiconductor component is implemented as a RB IGBT, a GTO or a thyristor.

17. The semiconductor component of claim 1, wherein the semiconductor component is implemented as a vertical diode in which the first semiconductor region forms a first emitter, the second semiconductor region forms a base region, and which further comprises a second emitter of the second conductivity type, wherein the base region is arranged between the first and the second emitter.

18. The semiconductor component of claim 1, wherein the semiconductor component is implemented as a vertical MOS transistor in which the first semiconductor region forms a body region, the second semiconductor region forms a drift region, and which further comprises:

at least one source region of the second conductivity type, wherein the body region is arranged between the source region and the drift region;

at least one gate electrode arranged adjacent to the body region and dielectrically insulated from the body region by a gate dielectric; and a drain region, wherein the drift region is arranged between the drain region and the body region.

19. The semiconductor component of claim 18, wherein the semiconductor component is implemented as a MOSFET, wherein the drain region is of the second conductivity type.

20. The semiconductor component of claim 18, wherein the semiconductor component is implemented as an IGBT, wherein the drain region is of the first conductivity type.

21. The semiconductor component of claim 1, wherein the sidewalls of the first trench are each beveled along crystal planes that extend at angles of between 45 degrees and 55 degrees relative to the first surface.

* * * * *